United States Patent [19]

Van Broekhoven

[11] Patent Number: 4,727,504

[45] Date of Patent: Feb. 23, 1988

[54] INTERFERENCE CANCELLER AND SIGNAL QUANTIZER

[75] Inventor: Paul Van Broekhoven, Needham, Mass.

[73] Assignee: The Charles Stark Draper Laboratory, Inc., Cambridge, Mass.

[21] Appl. No.: 627,982

[22] Filed: Jul. 5, 1984

[51] Int. Cl.[4] ............................................. G06F 7/38
[52] U.S. Cl. .................................................. 364/724
[58] Field of Search ...................................... 364/724

[56] References Cited

U.S. PATENT DOCUMENTS

| | | | |
|---|---|---|---|
| 3,946,214 | 3/1976 | Stuart et al. .................. | 364/724 |
| 4,007,341 | 2/1977 | Sourgens et al. ............. | 364/724 |
| 4,038,536 | 7/1977 | Feintuch ....................... | 364/724 |
| 4,178,550 | 12/1979 | Acampora et al. ........... | 371/37 |
| 4,412,341 | 10/1983 | Gersho et al. ................ | 364/574 |
| 4,471,399 | 9/1984 | Vdren ............................ | 375/17 |
| 4,564,952 | 1/1986 | Karabinis ...................... | 375/18 |

OTHER PUBLICATIONS

Modestino et al., "Adaptive Detection of Weak Signals in Statistically Undefined Noise Backgrounds", *Computer Processing in Communications*, pp. 629-650, 1969.

*Primary Examiner*—Gary V. Harkcom
*Assistant Examiner*—Dale M. Shaw

[57] ABSTRACT

Apparatus for improving the signal-to-noise ratio of a weak signal corrupted by a larger additive noise signal. The apparatus includes an analog to digital converter for quantizing the received weak signal plus noise signal into a word of greater than 3-states. Solid state digital memory is provided for storing a finite string of the quantized weak signal plus noise. A digital processor determines the discrete probability domain characteristics of the noise and computes an optimum discrete transfer function for operating on the received signal plus noise based on the probability law of the noise. The processor also quantizes the optimum discrete transfer function into two or three states and operates on the string of quantized weak signal plus noise with the quantized optimum discrete transfer function. In this way, the signal-to-noise ratio of the weak signal is improved and the string of quantized weak signal plus noise is represented by 2- or 3-state words.

12 Claims, 18 Drawing Figures

WEAK SIGNAL DETECTION THEORY

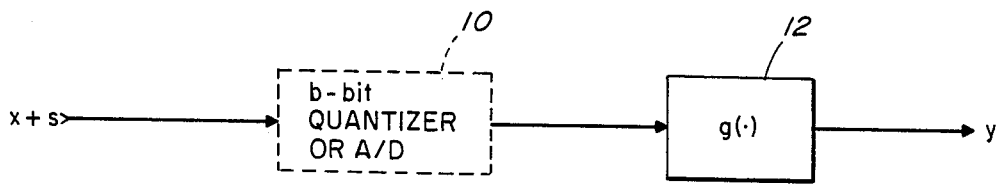

x = NOISE WITH PROBABILITY DENSITY f(x)
s = WEAK SIGNAL
g(·) = OPTIMUM NONLINEARITY $g(x) = -\dot{f}(x)/f(x)$
y = OPTIMIZED OUTPUT
$SNR_i = s^2 m_x$
$m_x$ = SECOND MOMENT OF x $$SNR_o = \frac{s^2 \left[ \int_{-\infty}^{+\infty} \dot{g}(x) f(x) \, dx \right]^2}{\int_{-\infty}^{+\infty} g^2(x) f(x) \, dx}$$

FIG. 1

WEAK SIGNAL OPTIMIZATION FOR CONTINUOUS TRIANGULAR NOISE DENSITY.

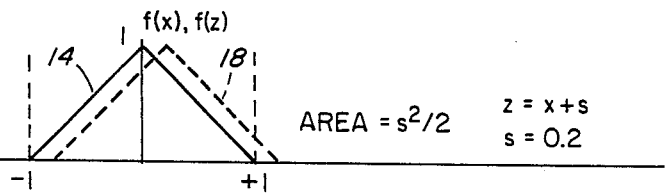

FIG. 2   AREA = $s^2/2$   z = x+s   s = 0.2

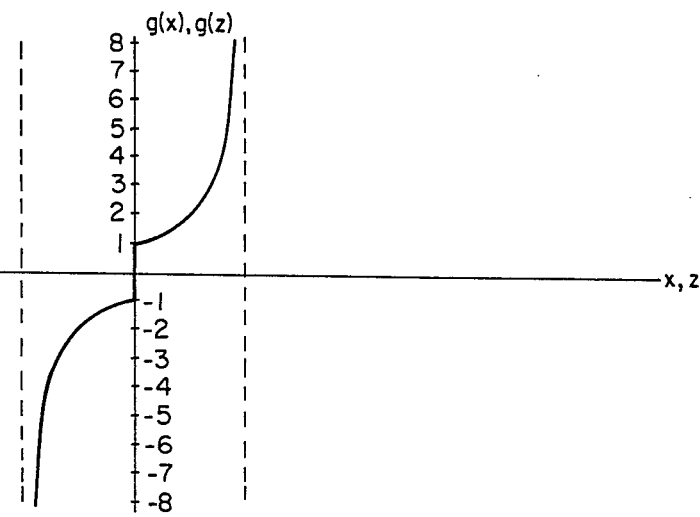

FIG. 3

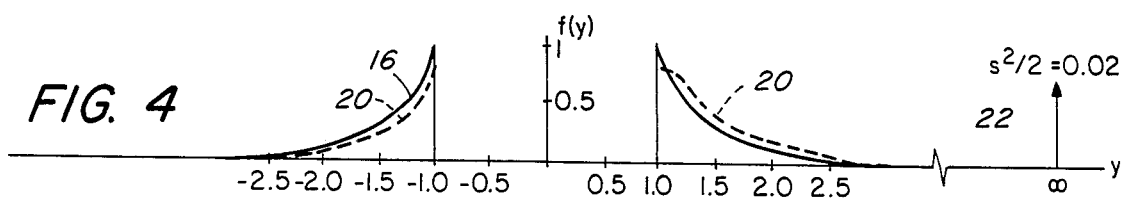

FIG. 4   $s^2/2 = 0.02$

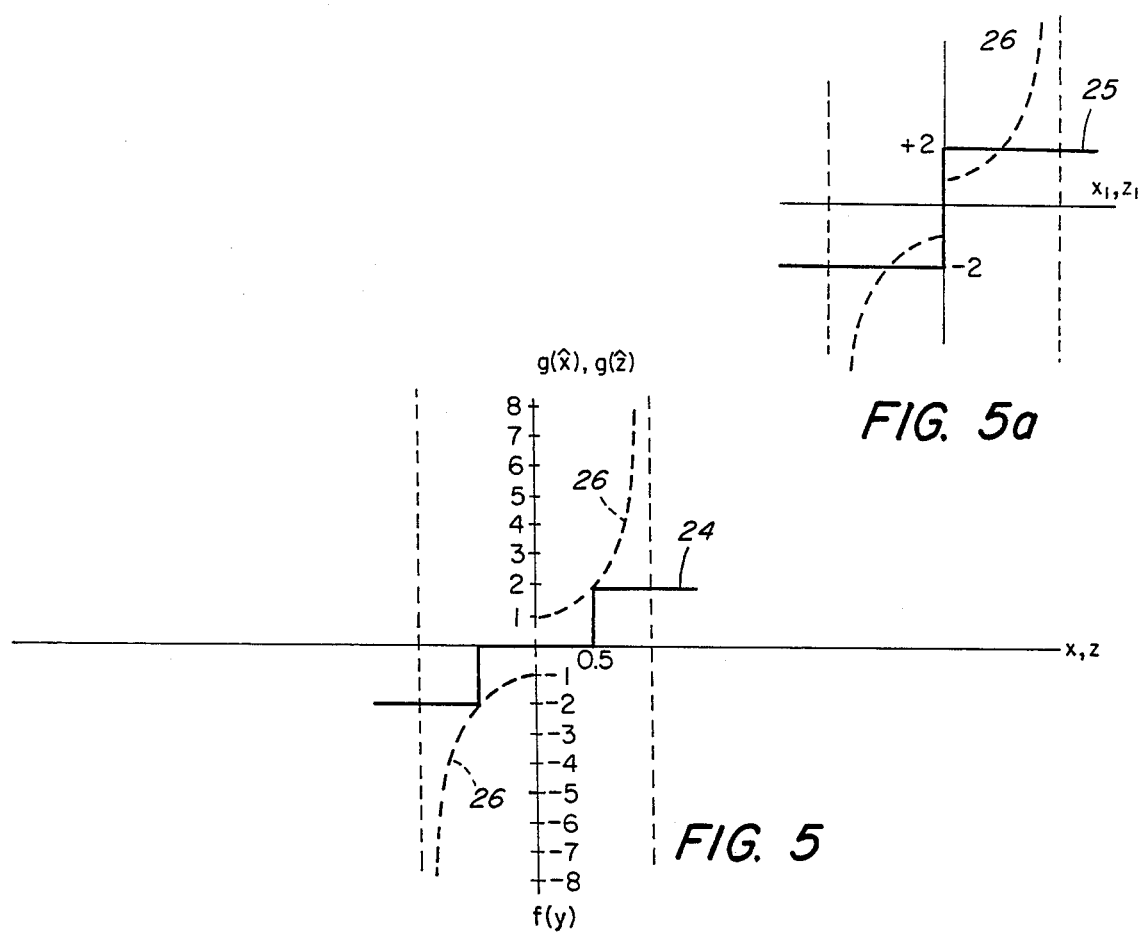
FIG. 5a
FIG. 5
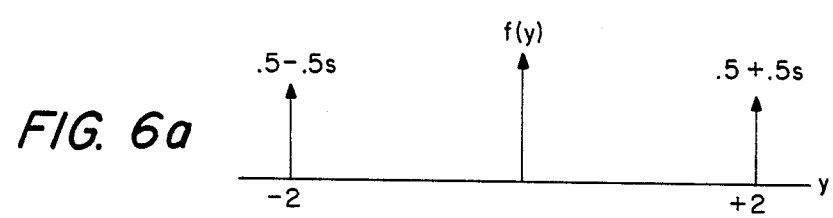
FIG. 6a
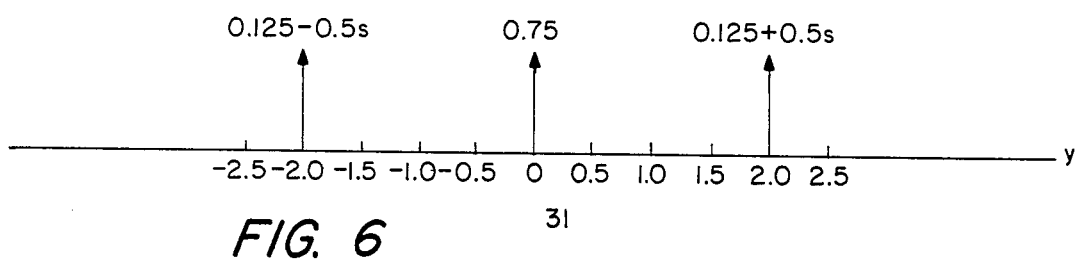
FIG. 6

DISCRETIZATION OF A CONTINUOUS DENSITY BY A QUANTIZER (A/D CONVERTER)

WEAK SIGNAL OPTIMIZATION FOR DISCRETE DENSITIES

INTERFERENCE CANCELLER AND SIGNAL QUANTIZER

BACKGROUND OF THE INVENTION

This invention relates to signal processing apparatus and more particularly to apparatus for improving the signal-to-noise ratio of a weak signal corrupted by stronger, non-stationary or non-gaussian noise, and also for minimizing quantization word length of the digital processor.

When processing signals corrupted by additive noise with digital circuits, it is necessary to provide a sufficient level of quantization (bits of word length) to accommodate the noise or interference as well as the signal. If the noise is substantially greater than the signal, the required quantization level must be increased. As quantization levels grow, so too does the size, power, weight and cost required to perform the signal processing task. It is desirable, then, to find ways to minimize word length or quantization prior to any computationally intensive signal processing operation. This minimization process must be accomplished without significant degradation of the signal-to-noise ratio.

In addition, significant levels of interference degrade system performance by introducing errors in the desired system outputs. It is thus desirable to reduce interference level by any means possible. Such interference may be either intentional such as jamming or unintentional such as radio interference from a radio communication link.

Many methods are available to reduce interference levels. These methods all require some knowledge of the noise characteristics. One class of interference cancellers is based on knowledge of the probability law of the noise. Generally, this information includes the second moment of the noise process and possibly even complete knowledge of the noise. It is generally the case that the more that is known about the probability law of the noise, the greater the potential enhancement in signal-to-noise ratio. In some applications, the probability law of the additive noise is known and in that case, implementation of a probability domain interference canceller is straightforward. In other applications, the nature of the interference is completely unknown beforehand and measurements must be made on the noise before any enhancement in the signal-to-noise ratio or minimization of quantization is possible.

It is therefore an object of this invention to provide an interference canceller in which the probability law of a possibly non-stationary and unknown interference source is learned and to use this information to enhance signal-to-noise ratio and minimize quantization of the digital processor.

Yet another object of this invention is to provide such an interference canceller which can improve the signal to noise ratio when the noise source is zero- or non-zero-mean and non-gaussian.

Still another object of this invention is to provide such an interference canceller which is able to improve signal-to-noise ratio in real time.

A still further object of the invention is an interference canceller which can be implemented with known digital processing integrated circuits.

SUMMARY OF THE INVENTION

The interference canceller disclosed herein for improving the signal-to-noise ratio of a weak signal corrupted by a large additive noise signal includes analog-to-digital converter apparatus for quantizing the weak signal plus noise into a word of greater than 2 or 3 states in length. Solid state memory is provided for storing a finite string of the quantized weak signal plus noise. A digital processor is utilized for determining the discrete probability law of the noise and for determining an optimum discrete transfer function based on the probability law of this noise. The digital processor also quantizes the optimum discrete function to two or three states and operates on a string of the quantized weak signal plus noise with the quantized optimum discrete transfer function. In this way, the signal-to-noise ratio of the weak signal is improved and the string of quantized weak signal plus noise can be represented by 2- or 3-state words.

In a preferred embodiment, the analog-to-digital converter generates 6 to 8-bit words and the three states of the optimum discrete function are $-1$, 0, and $+1$. In this embodiment, the analog-to-digital converter operates at greater than 10 MHz conversion speed.

BRIEF DESCRIPTION OF THE DRAWING

The invention disclosed herein will be better understood with reference to the following drawing of which:

FIG. 1 is a block diagram description of weak signal detection theory;

FIG. 2 is a graphical representation of noise having a triangular noise density $f(x)$ (solid line) and a signal plus noise density $f(z)$ (dotted line) where the signal is, for example, a weak constant and $Z=X+S$.

FIG. 3 is a graphical representation of an optimal nonlinearity derived from the triangular noise density of FIG. 1;

FIG. 4 is a graphical representation of the noise density of FIG. 2 (solid line) after operation upon by the non-linearity of FIG. 3 as well as the signal plus noise density (dotted line and impulse at infinity);

FIG. 5 is a graphical representation of a quantization of an optimal non-linearity;

FIG. 5a is a graphical representation of a 2-state quantization of an optimal nonlinearity;

FIG. 6 is a graphical representation of the triangular signal plus noise density after operation upon by the quantized optimum function of FIG. 5;

FIG. 6a is a graphical representation of the triangular signal plus noise density after operation upon by the quantized optimum function of FIG. 5a;

DESCRIPTION OF THE PREFERRED EMBODIMENT

Figure 7:
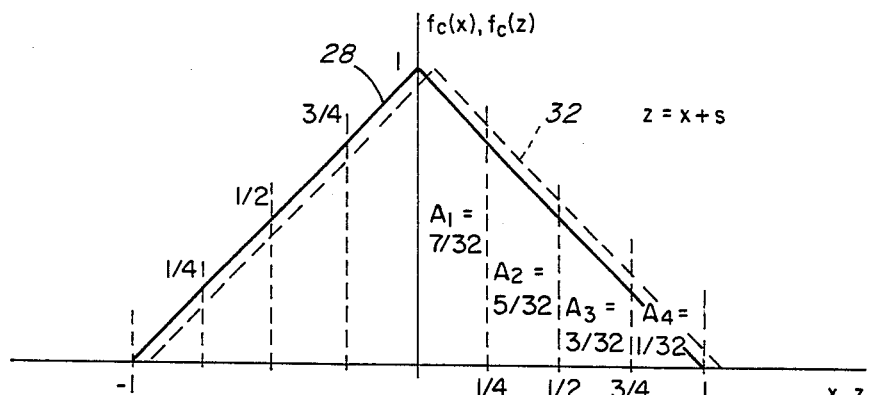
FIG. 7 is a graphical representation of noise having a triangular noise density (solid line) and signal plus noise (dotted line)

The interference canceller and signal quantizer disclosed herein is based on weak signal detection theory. Briefly, if a signal, s, in the presence of a larger noise, x, is passed through a non-linearity g(·), the resulting waveform y will have an improved signal-to-noise ratio over the signal s if x is non-gaussian and if the non-linearity takes the form $g(x) = -f(x)/f(x)$. In this equation, f(x) is the probability density of the variable x. The major problem in using this theory in a practical implementation in real time lies in the estimation of f(x) and the subsequent determination of g(·). If a b-bit quantizer or analog-to-digital converter precedes the non-linearity g(·), the theory is much the same. FIG. 1 illustrates the weak signal detection theory concept. The weak signal s plus the larger noise signal x enters an analog-to-digital converter 10 where it is quantized to create a digital word having 8 bits, for example. The quantized signal then passes through a non-linear element 12 to generate the output signal y. As discussed above, if the nonlinear element 12 is suitably chosen, the signal-to-noise ratio of the output signal y will be improved over that of the input assuming that the noise signal x is non-gaussian with a zero mean. The implementation disclosed herein is optimum for statistically independent noise but improvement results even if there is sample-to-sample correlation.

An example will illustrate implementation of the theory in a continuous case, that is, in a situation in which the quantizer 10 is not included. By way of example only, if the probability density of the noise, x, is given by a unit triangular pulse 14, as shown in FIG. 2, the optimum non-linearity is shown in FIG. 3. If no small signal s were present, the probability density of the noise, x, after passing through the non-linearity of FIG. 3 is shown as the solid curve 16 in FIG. 4. If a weak signal s (represented by a small positive constant, for example) is added to x, the resulting waveform will have probability density f(z), shown as the dotted curve 18 in FIG. 2. After the signal plus noise z passes through the nonlinearity of FIG. 3, the probability density f(y) of FIG. 1 is modified and is shown by the dotted lines 20 in FIG. 4. An impulse 22 at infinity of area $s^2/2$ appears in f(y) and the signal to noise ratio of y is thus infinite. Practically, it will not be possible to realize infinite output signal-to-noise ratio since infinite dynamic range signal processing would be required to process the resulting waveform. Signal-to-noise ratio improvement, however, can still be realized with less than infinite dynamic range signal processing. As can be seen from the density f(y) in FIG. 4, the dynamic range has been expanded by passing the signal z through the non-linearity of FIG. 3. This result is true even if the impulse at infinity is disregarded. Because of this increase in the dynamic range, signal correlation or detection requires electronics with additional size, power and weight. The improvement in signal-to-noise ratio has thus come at a price.

As a means of avoiding this increase in dynamic range, the applicant herein has proposed a two or three state quantization of ĝ(·) as shown for three state by the solid line 24 in FIG. 5. In this case, the non-linearity will assume the three values −2, 0 and +2 as an approximation to the continuous curve shown as the dotted line 26. When the signal plus noise z is passed through this three state quantization approximation of the optimal function g, the probability density f(y) will become impulsive and the presence or absence of the weak signal, s, is contained in the areas of the impulses of f(y) as shown in FIG. 6. The signal to noise ratio gain is no longer infinite, in fact there is a small loss, but only three states are required to represent the weak signal plus noise. As a result, the processing of y can be accomplished in low power digital electronics. The signal to noise ratio gain against many practical forms of non-gaussian noise is still substantial given a three state approximation of g(·).

Instead of the three state quantization, a two state quantization can be utilized as shown in FIGS. 5a and 6a. In FIG. 5a, the nonlinearity is quantized to assume only the values −2 and +2 as an approximation to the curve 26. When the signal plus noise Z is passed through this two state quantization approximation of the optimum function g, the probability density f(y) will become impulsive and the presence or absence of the weak signal, s, is contained in the areas of the impulses of f(y) shown in FIG. 6a. The impulse at the origin of FIG. 6 is absent when two state quantization is used.

Figure 8:
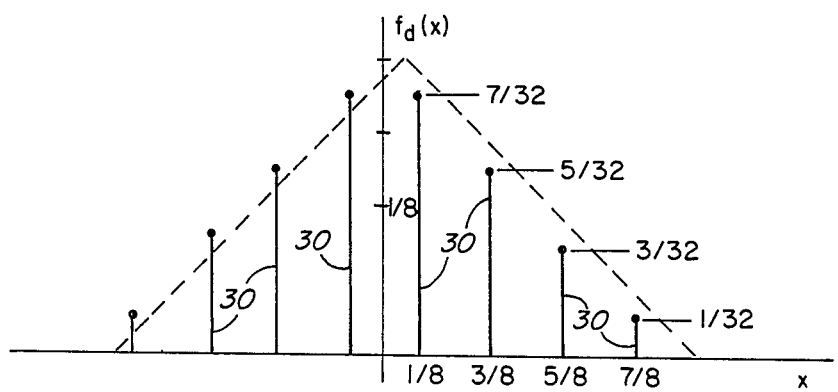
FIG. 8 is a graphical representation of a discrete version of the noise density of FIG. 7.
Figure 9:
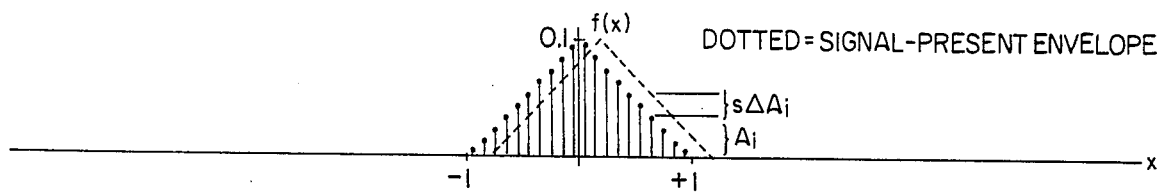
FIG. 9 is a graphical representation of a discrete triangular noise density showing also the signal-plus-noise envelope (dotted line)
Figure 10:
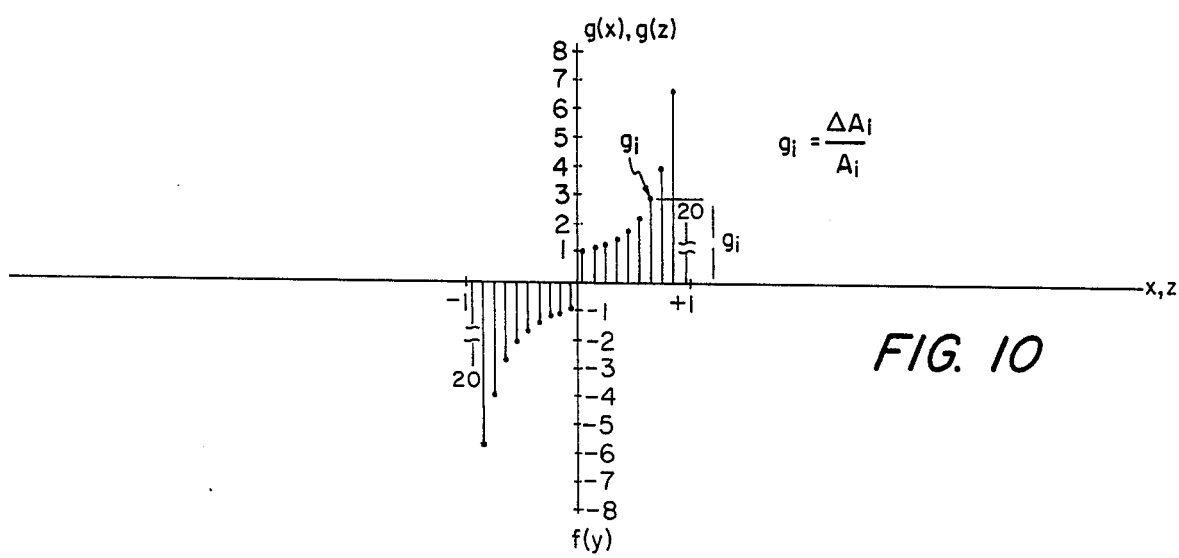
FIG. 10 is a graphical representation of a discrete optimal non-linearity derived from FIG. 9.
Figure 11:
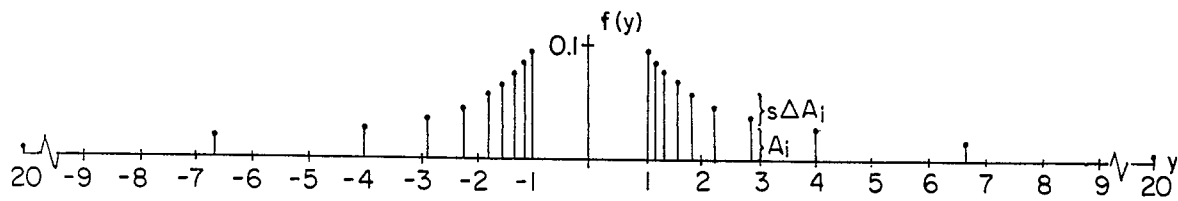
FIG. 11 is a graphical representation of a discrete noise density function derived by operating the non-linearity of FIG. 10 on the triangular noise density of FIG. 9 including the perturbations caused by presence of a weak signal.

As stated above, the previous example considered the case of continuous amplitude signals, that is, without the quantizer 10 of FIG. 1. If an analog-to-digital converter is used to quantize the received signal plus noise prior to the non-linearity g(·), the theory and approach to the three state g(·) quantization problem is much the same. An A/D converter operating on the received signal plus noise acts to discretize its probability density prior to the non-linearity g(·). The effect of a 3-bit A/D converter on a unit triangular noise process is shown in FIG. 7. The effect is to discretize the continuous noise density $f_c(x)$ shown by the solid line 28 in FIG. 7 into a discrete density $f_d(x)$ shown by the discrete function 30 in FIG. 8. For example, all samples of the continuous process, x, occurring between 0 and ¼ are assigned the value ⅛ by the A/D converter. The amplitude of the "line" of $f_d(z)/s=0$ at ⅛ is then the probability of observing the value ⅛ and is given by the partition area $A_1$ of $f_c(x)$ as shown in FIG. 7. Addition of a weak signal, s, to the noise, x, will cause the density $f_c(x)$ to shift incrementally to the right in FIG. 7, assuming that the small signal, s, is, for example, constant. The shifted density $f_c(z)$ is shown as the dotted line 32 in FIG. 7. Thus, the partition areas $A_n$ and hence the amplitudes of $f_d(z)$ (defined as the discrete form of $f_c(z)$) will change. The weak signal therefore modulates the amplitudes of the discrete density function $f_d(x)$ shown in FIG. 8. FIG. 9 illustrates a unit triangular noise process coupled with an A/D converter. The function g(·) shown in FIG. 10 is now seen to be discrete and is defined by $\Delta A_i/A_i$ in a manner analogous to the $-f(·)/f(·)$ ratio for the continuous case. As a result, the density f(y) shown in FIG. 11 is discrete with the amplitude of the "lines" incrementally dependent on the presence or absence of the weak signal. The similarity of the curves shown in FIGS. 9–11 to those of the continuous case illustrated in FIGS. 2–4 is evident. The greatest difference lies in the absence of the impulse at infinity in the discrete case.

The implementation of the invention disclosed herein is based on an initial 6 to 8-bit A/D conversion of the received signal including noise. A large number of consecutive samples are stored digitally in a semiconductor memory. This absolute fidelity data storage is a missing ingredient in prior analog-based quantizing approaches. The statistical properties of the stored signal plus noise are then estimated. The estimates of the statistical properties of the noise are then used to reduce the quantization of the 6 to 8-bit samples to three states for correlation/detection. Importantly, this technique requires no added noise for its operation as in the prior art. As a result, it is often possible to realize significant improvements in signal to noise ratio as well as a minimization of quantization.

Figure 12:
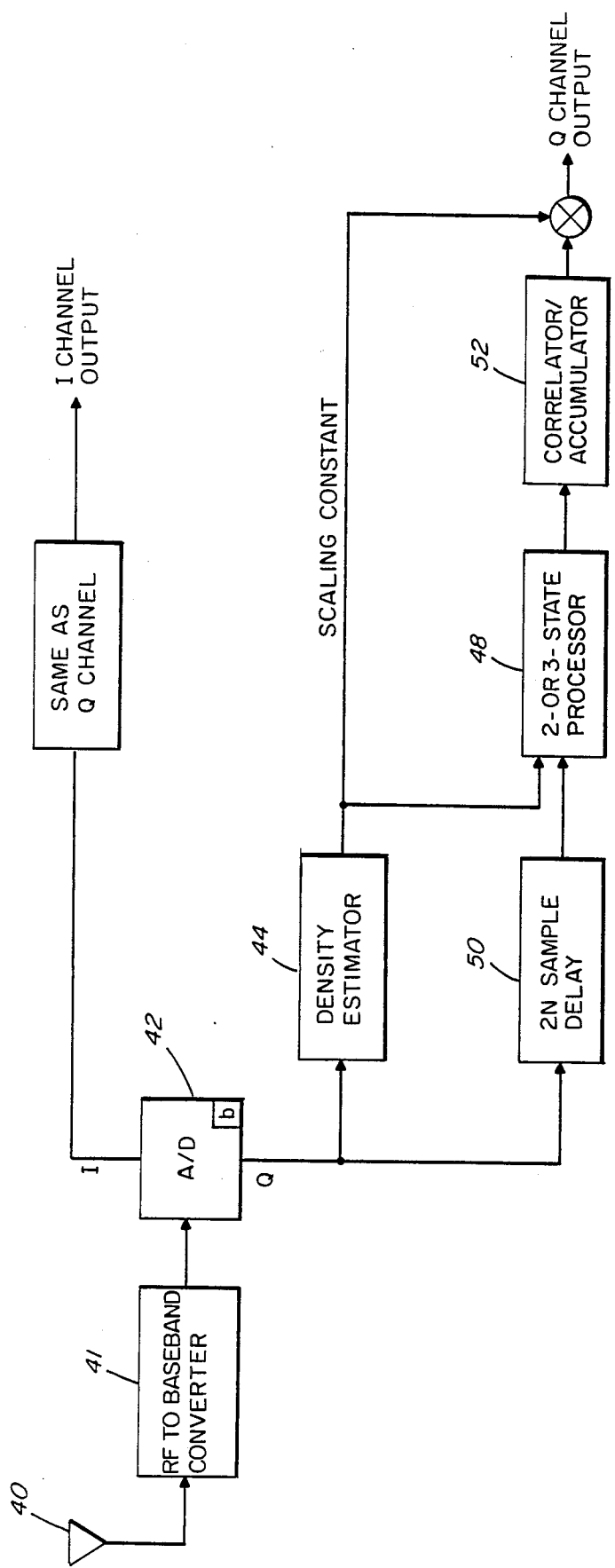
FIG. 12 is a block diagram illustrating the implementation of the invention disclosed herein.

FIG. 12 is a block diagram illustrating the implementation of the above-described technique. A signal, including noise, is received at an antenna 40, passes through an RF-to-baseband converter 41 and enters an analog to digital converter 42 in which the in-phase signal or (I) channel is quantized into a b-bit word. Processing on quadratuire (Q) channel data is similar. A string of quantized data enters the density estimator 44 which calculates the statistical properties of the noise process of the signal as discussed above. The derived statistical properties are then used to calculate the optimum non-linearity $g(\cdot)$. The output of the density estimator 44 is then used to set the thresholds and other characteristics of the three state processor 48. The string of quantized signals which entered the density estimator 44 also enter the 2n sample delay element 50 from which they enter the three state processor 48 where they are operated on according to the optimum non-linearity calculated in the density estimator 44. A scaling constant is used to stabilize the post correlation signal voltage. A correlator/accumulator 52 is then used to process the signal for extraction of information.

Figure 13:
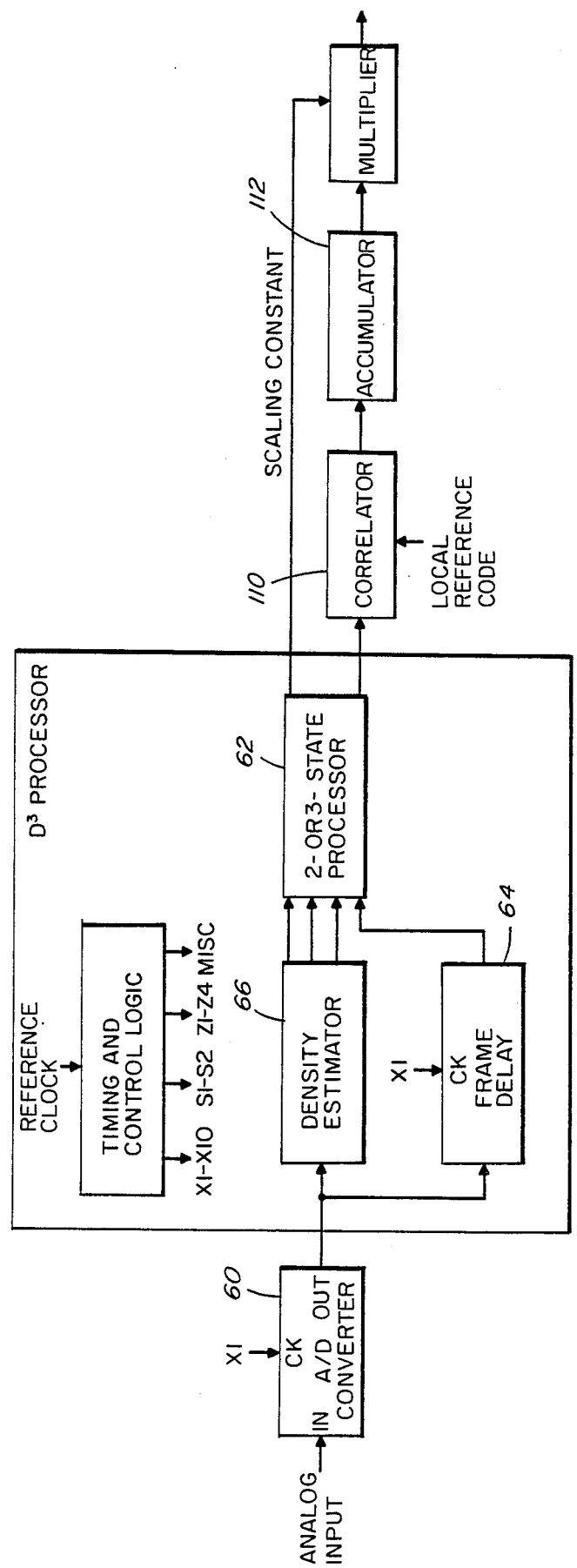
FIG. 13 is a block diagram of an interference canceller disclosed herein.

FIG. 13 is a top level view of the processor disclosed herein. The analog input, consisting of a weak spread spectrum signal plus noise, is digitized by an A/D CONVERTER 60. The processing of the A/D data proceeds in four distinct and sequential steps or modes. The A/D converter 60 output data stream is assumed to be continuous since this is a worst case. Under these conditions, the processor must provide for 100% intercept of the received record of signal plus noise. The A/D output under these circumstances is divided into sequential frames, each of N points or samples, and each frame is processed separately. The frames are numbered beginning with Frame 1 which starts at a chosen reference time called time-zero. The odd numbered frames are termed "odd" frames and the even numbered frames are termed "even" frames.

During mode 1, the first N points from the A/D converter 60 are used to form an estimate of the probability density function (PDF) of the noise. The function that is actually estimated is $Nf(x_i)\Delta x$ or simply $Kf_i$, where the amplitude of the function $Kf_i$ is proportional to the number of points per frame, N, and the A/D converter 60 LSB width, $\Delta x$. The quantity $f(x_i)\Delta x$ is the area $A_i$ previously referred to. During mode 2, the estimate of $Kf_i$ is refined by a linear transversal filter, and the final estimate $\hat{K}f_i$ is also differentiated to form an estimate of $K\hat{\Delta}f_i$. Since the PDF of the local reference code is assumed to be even symmetric, as is usually the case, the precorrelation noise PDF estimated above can be used to predict the post-correlation noise PDF simply by averaging the $\hat{K}f_i$ symmetrically about zero. It is the estimate of the post-correlation noise PDF which is the final desired result.

The ratio $(K\hat{\Delta}f_i/\hat{K}f_i)$, termed $\hat{g}_i$, is then formed in the 2- OR 3-STATE processor 62 of FIG. 13. For 3-state processing, the value of $\hat{g}_i$ associated with each A/D state is stored as is the accumulated value of $K\hat{\Delta}f_i$ and $\hat{K}f_i$ associated with each $\hat{g}_i$. For 2-state processing, the sign of $K\hat{\Delta}f_i$ associated with each A/D sample is stored.

During mode 3, the accumulated values of $\hat{K}f_i$ and $K\hat{\Delta}f_i$ associated with each $\hat{g}_i$ are used to optimize output signal-to-noise ratio by computing a threshold value of $|\hat{g}_i|$ for use in the final quantization operation occurring in the 3-state processor of FIG. 13. This operation is not necessary if 2-state processing is used. Finally, during mode 3, a scaling constant used to stabilize post-correlation signal amplitude is computed for later use.

During mode 4, the N-point data frame emerges from the FRAME DELAY 64 of FIG. 13. For 3-state processing, each A/D sample is used to loop up its associated $\hat{g}_i$ value. This value is compared to the threshold value of $\hat{g}_i$ computed in Mode 3. If the value of $\hat{g}_i$ is greater than the threshold, the A/D sample is replaced with $sgn(\hat{g}_i)$. If this is not the case, the A/D sample is replaced with zero. The original multi-bit A/D sequence is thus replaced with a three-state sequence. For 2-state processing, the A/D samples emerging from the delay are used to look up and are replaced by their associated value of $sgn(K\hat{\Delta}f_i)$.

The two- or three-state sequence is then correlated with the local reference code, and the results of correlation are accumulated and scaled as shown in FIG. 13. The final output of FIG. 13 is the desired signal with amplitude equivalent to that of a linear processor, but with improved signal-to-noise ratio against non-gaussian interference. A requirement which is clear is that Modes 1 through 3 of Frame 2 occur during Mode 4 of Frame 1. As a result, the processor must be pipelined to achieve 100% intercept.

Operation of the density estimator 66 and the 2- or 3-state processors will now be described in more detail. The density estimator functions in Modes 1 and 2. In Mode 1, the density estimator 66 of FIG. 14 constructs an estimate of the noise PDF by constructing a histogram of the N-point frame. The histogram is held in RAM 68 with even and odd frames using two different RAMs. The DPDT 70 and SPDT 72 switches are used to multiplex the RAMs between odd and even frames using the odd/even of OE control signal. The histogram for Frame 1 (odd) is constructed as follows. A/D data of $b_1$ bits passes through an absolute value element which changes all negative A/D values to their positive equivalent. The zero A/D state is unchanged. The extra negative state is mapped to the maximum positive state. This is done as a result of the even symmetric signal PDF assumption previously cited. The rectified A/D data passes through the DPDT 70 switch to the odd frame $f_i$ RAM. The operation of the RAM in conjunction with the accumulator (ACCUM) will now be discussed. The Frame 1 mode gate exists for $N+\frac{1}{2}$ ticks of the A/D clock. Signal Z1 clears the RAM to start the process. Next, the first A/D sample appears on the address input of the RAM which is in the read mode according to signal S1. At this time, the accumulator 74 is in the write mode according to signal $\overline{S1}$. As a result, the contents of the RAM associated with the value of the first A/D state appear at the RAM D interface. The accumulator 74 is permanently set to the add mode. The first edge of clock X2 transfers the RAM data into the accumulator 74 on its IO input. The accumulator's IN input, which is the number one (unless the A/D state is zero, when it is two) is also transferred into the accumulator's internal address. The first edge of clock X3 then transfers the sum to the accumulator output latch where the negative going edge of $\overline{S1}$ transfers the new value into the RAM. The use of $\overline{S1}$ to control the IO state (ON or OFF) of the accumulator ensures interface compatability with the RAM. The process then continues for the next (N−1) A/D states in the first frame. In this way, the RAM individually counts the number of occurrences of each A/D state in the N-point record. The zero A/D state occurrences are counted by twos to compensate for the lack of a positive/negative pair in the discrete noise PDF.

After the initial histogram is complete, the two switches are configured to bring the EVEN FRAME RAM-ACCUMULATOR on-line for the next N-point A/D record while the Frame 1 histogram is read from the ODD FRAME RAM-ACCUMULATOR. The A/D STATE COUNTER generates the address required to read the Frame 1 histogram from the RAM.

Figure 14:
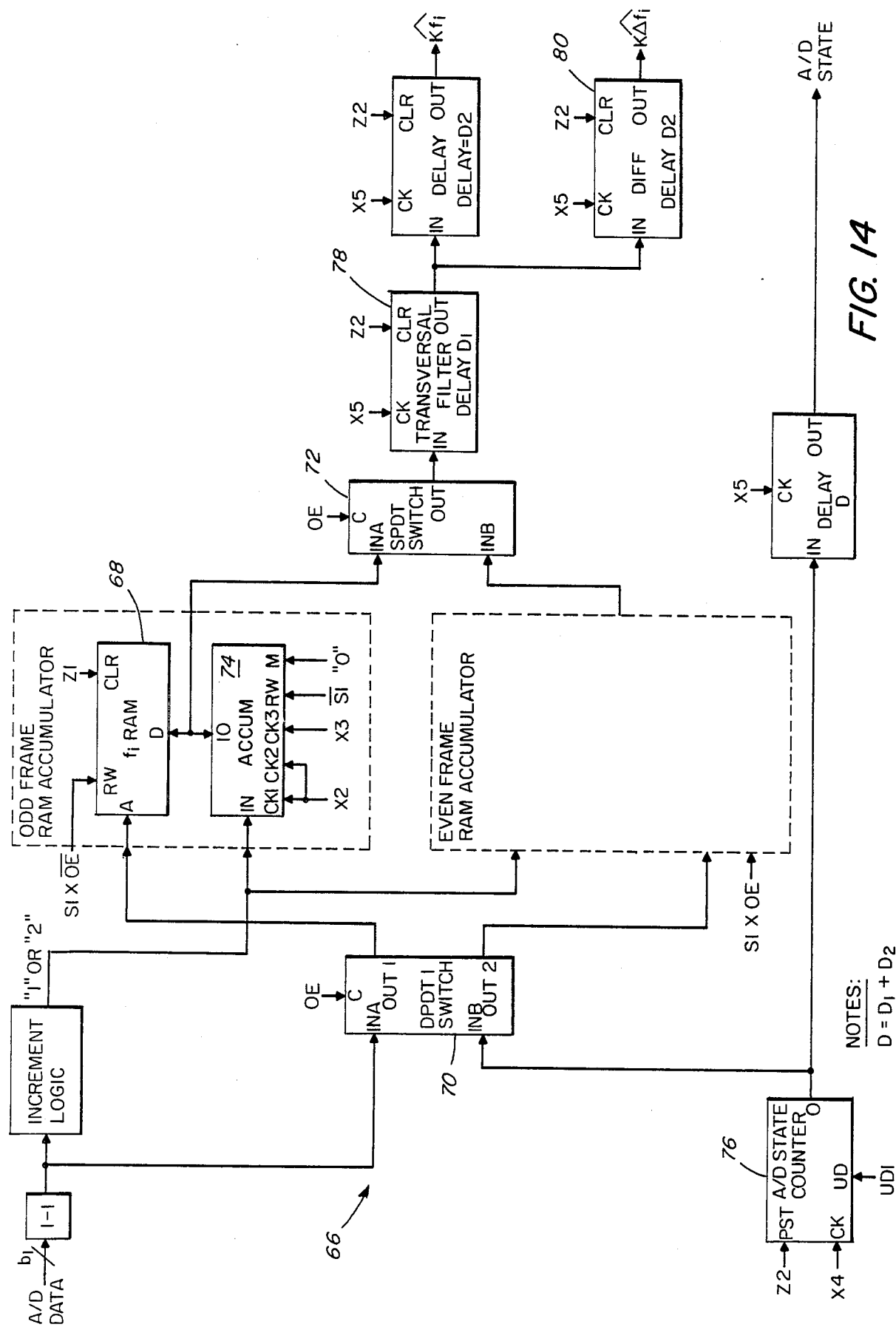
FIG. 14 is a block diagram of the density estimator.

The A/D STATE COUNTER 76 of FIG. 14 begins counting at the maximum positive A/D state value of $2^{(b1-1)}-1$ and counts down to zero, reverses, and then begins to count back up to $2^{(b1-1)}-1$. The A/D STATE COUNTER 76 is initialized to its maximum state by Z2 prior to this process.

The histogram or discrete PDF estimate passes through the SPDT SWITCH 72 to the TRANSVERSAL FILTER, TF 78. This tapped delay line filter has also been cleared to zero by Z2 prior to the start of Mode 2. The TF 78 is used to improve the estimate of the noise PDF by reducing both bias due to signal and short term statistical fluctuations in the histogram. There is necessarily some delay through the filter, with a given A/D output state's $K\hat{f}_i$ value emerging $D_1$ ticks of X5 after its emergence from the RAM.

Since the PDF estimate emerging from the TF 78 is even symmetric, only the first half of the data is needed, and the A/D STATE COUNTER 76 stops counting when the $K\hat{f}_i$ estimate corresponding to the zero A/D state emerges from the TF. This requires $D_1+2^{(b1-1)}$ ticks of the X1 clock which are contained in an early Mode 2 gate.

For 100% intercept of the A/D data, it is necessary to unload a given frame's histogram from the RAM 68 during the subsequent N-point frame in order to clear the memory for the following frame. This leads to a requirement that $$N > 2^{b1-1} + D_1$$

for 100% intercept.

After the data exits the TF 78, it passes to a differentiator, DIFF 80, which computes a first difference or derivative $K\hat{\Delta f}_i$ of $K\hat{f}_i$ for each A/D state. There is a small delay, $D_2$, associated with the differentiation, so a matching delay $D_2$ is placed in the $K\hat{f}_i$ path as well. The initialization signal Z2 clears both of these blocks prior to the start of Mode 2.

Finally, the A/D state associated with each $K\hat{f}_i$ and $K\hat{\Delta f}_i$ point is provided by delaying the A/D STATE COUNTER 76 output by D, the sum of the TF 78 and DIFF 80 delays $D_1$ and $D_2$. A second late mode gate is developed and used to control subsequent processing. This gate is $2^{b-1}$ ticks of X5 in length which is the number of positive A/D states plus one for the zero state. It marks the period of validity of the data which passes to subsequent processing stages.

The $(2^{b1}-1)$ A/D states, together with their associated values of $K\hat{f}_i$ and $K\hat{\Delta f}_i$, are passed to either the 2- or 3-state processor which functions in Modes 2, 3, and 4.

Figure 15:
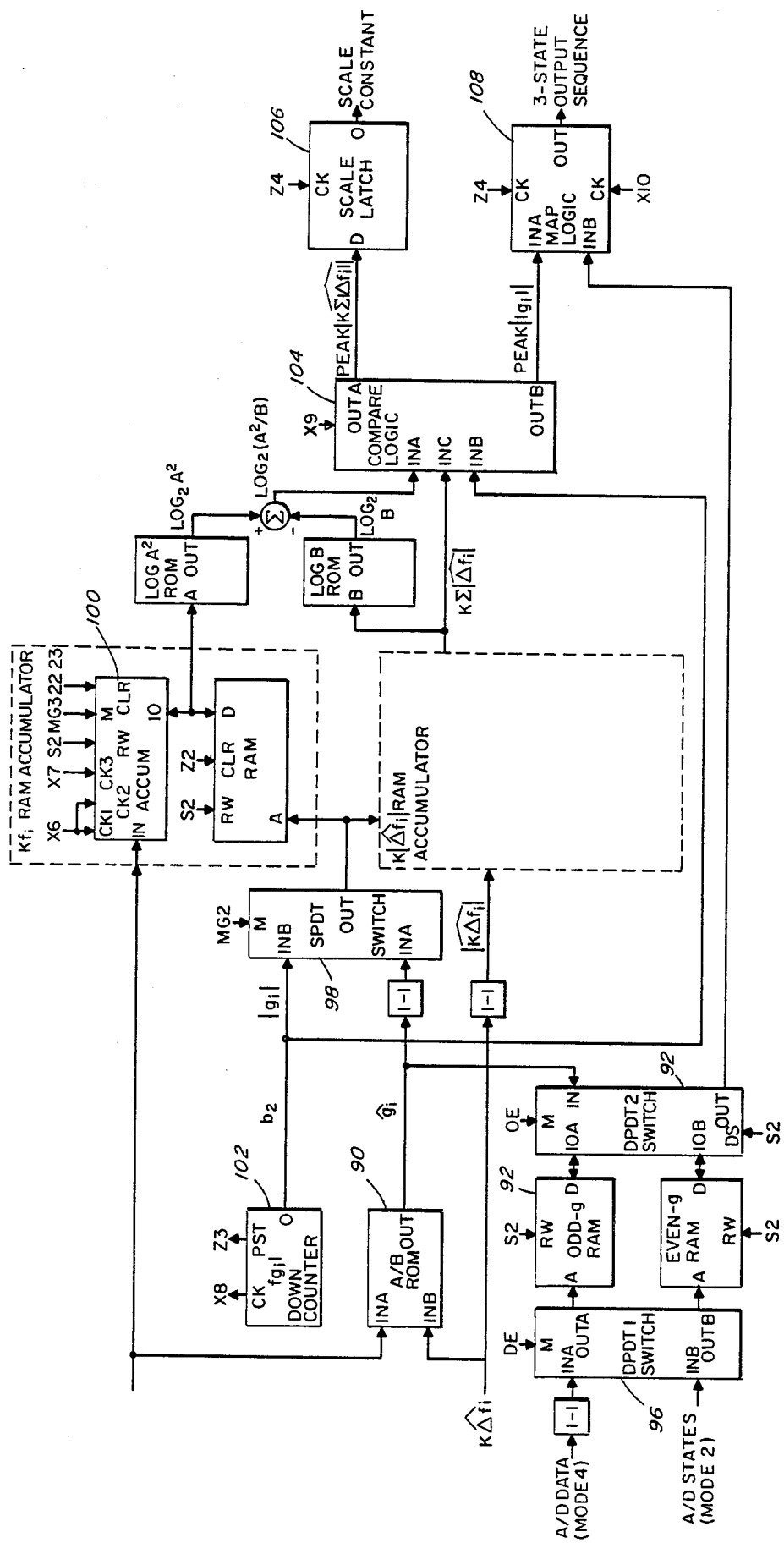
FIG. 15 is an implementation of a 3-state processor.

A 3-state processor is shown in FIG. 15. The processing which completes Mode 2 can be described as follows. The PDF estimates $K\hat{f}_i$ and $K\hat{\Delta f}_i$ are input to a ROM 90 where, together, they comprise the input word. The ROM maps this composite input into an output, $\hat{g}_i$, which represents the quotient of the inputs (except the value of $\hat{g}_i$ is set to maximum whenever $K\hat{f}_i$ is zero). The value of $\hat{g}_i$ so determined is used for two purposes.

First, the values of $\hat{g}_i$ pass through the DPDT2 SWITCH 92 to the data input of the ODD-g RAM 94. Here they are entered into an address location corresponding to their A/D state. This A/D state is the delayed output of the A/D state counter described in the previous section. It is routed to the address input of the ODD-g RAM 94 through the DPDT1 SWITCH 96. The odd/even RAMs and DPDT switches are used to provide 100% intercept of the A/D data.

The second use of the $\hat{g}_i$ values involves accumulation of the $|K\hat{\Delta f}_i|$ and $K\hat{f}_i$ values associated with each $\hat{g}_i$. This accumulation supports the signal-to-noise ratio optimization procedure. A SPDT SWITCH 98 routes the computed $g_i$ values to the address input of the FIG. 15 RAMs, and the content of the RAMs in the first $g_i$ location appears immediately at their data outputs, and hence at the IO terminals of an accumulator 100 (ACCUM). The RAMs are in the read mode and the accumulators in the write mode at this time. The RAM outputs and the corresponding $|K\hat{\Delta f}_i|$ and $K\hat{f}_i$ words are transferred to the adder internal to the accumulator 100, where the current $|K\hat{\Delta f}_i|$ and $K\hat{f}_i$ values are added to the previous accumulation. For the first data sample of each $\hat{g}_i$, the RAM contents are zero due to initialization by Z2. The first edge of clock X7 then transfers the adder output data to the accumulator's output latch, and the first edge of read/write control S1 transfers the new sum back into the same $\hat{g}_i$ location in the RAMs. The process then repeats for the next $(2^{(b-1)}-1)$ A/D states and associated $\hat{g}_i$ values. The trailing edge of the late mode gate MG2L marks the end of Mode 2.

In Mode 3, a threshold value $|g_i|$ is computed which optimizes output signal-to-noise ratio. The $|g_i|$ DOWN COUNTER 102 of FIG. 15 is initialized to its maximum state by Z3, and clock X8 is used to generate a decreasing sequence of $|g_i|$ values.

The sequence of $|g_i|$ values is then routed through the SPDT SWITCH 98 to the RAM-accumulators. Beginning with the highest $|g_i|$ value, the accumulated values of $K|\hat{\Delta f}_i|$ and $K\hat{f}_i$ are read from the RAMs into the accumulator which has been set to the accumulate mode. The first accumulated $K|\hat{\Delta f}_i|$ and $K\hat{f}_i$ are transferred to the accumulator's adder by the first edge of X6. Here they are added to the previous value to produce the running sums $K\Sigma|\hat{\Delta f}_i|$ and $K\Sigma\hat{f}_i$. The first edge of X7 transfers the result to the output latch where S2 then places it on the IO bus. The accumulated outputs $A(K\Sigma\hat{f}_i)$ and $B(K\Sigma|\hat{\Delta f}_i|)$, the running sums, are routed to ROMs to form the function log $(A^2/B)$ which is a unique function of output signal-to-noise ratio. The sequence of log $(A^2/B)$ values which arises from the clocking of the $|g_i|$ DOWN COUNTER 102 by X8 is routed to the COMPARE LOGIC 104 and latched by X9. The values of $K\Sigma|\hat{\Delta f}_i|$ and $|g_i|$ which correspond to a given value of log $(A^2/B)$ are also entered by X9. The COMPARE LOGIC 104 then compares the current value of log ($A^2/B$) with previous values and saves the maximum or peak value occurring over all $|g_i|$ states of the $|g_i|$ counter. The peak value of the function log ($A^2/B$) will correspond to the peak value of output signal-to-noise ratio. Also saved are the values of $K\Sigma|\hat{\Delta f_i}|$ and $|g_i|$ which correspond to the peak value of log ($A^2/B$). Mode 3 ends after all $2^{b2}$ states of the $|g_i|$ counter have been exercised.

Mode 4 begins when Z4 latches the Mode 3 results of PEAK $\{K\Sigma|\hat{\Delta f_i}|\}$ and PEAK $\{|g_i|\}$ into a SCALE LATCH 106 and MAP LOGIC 108 as shown in FIG. 15. The odd/even or OE control line controlling the DPDT 1 and 2 switches 96 and 92 is changed to a logic one, and the A/D data emerging from the FRAME DELAY 64 in FIG. 13 is routed through an absolute value element to the address of the ODD-g RAM. Each of the original N A/D points is then replaced with its corresponding $\hat{g}_i$ value computed in Mode 3. This $\hat{g}_i$ value passes through the DPDT2 SWITCH 92 to the MAP LOGIC 108 where $|\hat{g}_i|$ is compared to the threshold value of $|g_i|$ computed in Mode 3 and stored in the MAP LOGIC 108. If the value of $|\hat{g}_i|$ is greater than or equal to the threshold value, the $|\hat{g}_i|$ value is replaced with sgn($\hat{g}_i$). If not, the $|\hat{g}_i|$ is replaced with zero. A three-state sequence therefore emerges from the MAP LOGIC 108 clocked by X10, which is a clock, one-half cycle delayed, from A/D clock X1.

The three-state output of the MAP LOGIC proceeds to the CORRELATOR 110 of FIG. 13 where it is multiplied by the local reference sequence and accumulated in an accumulator 112. After N-points have been accumulated, the output of the post-correlation accumulator 112 is multiplied by the scale factor derived in Mode 3.

Mode 4 ends when all N-points have been read from the ODD-g RAM. At some time during Mode 4, the EVEN-g RAM processes data from Frame 2. The 100% intercept operation of the 3-state processor is thus assured.

Figure 16:
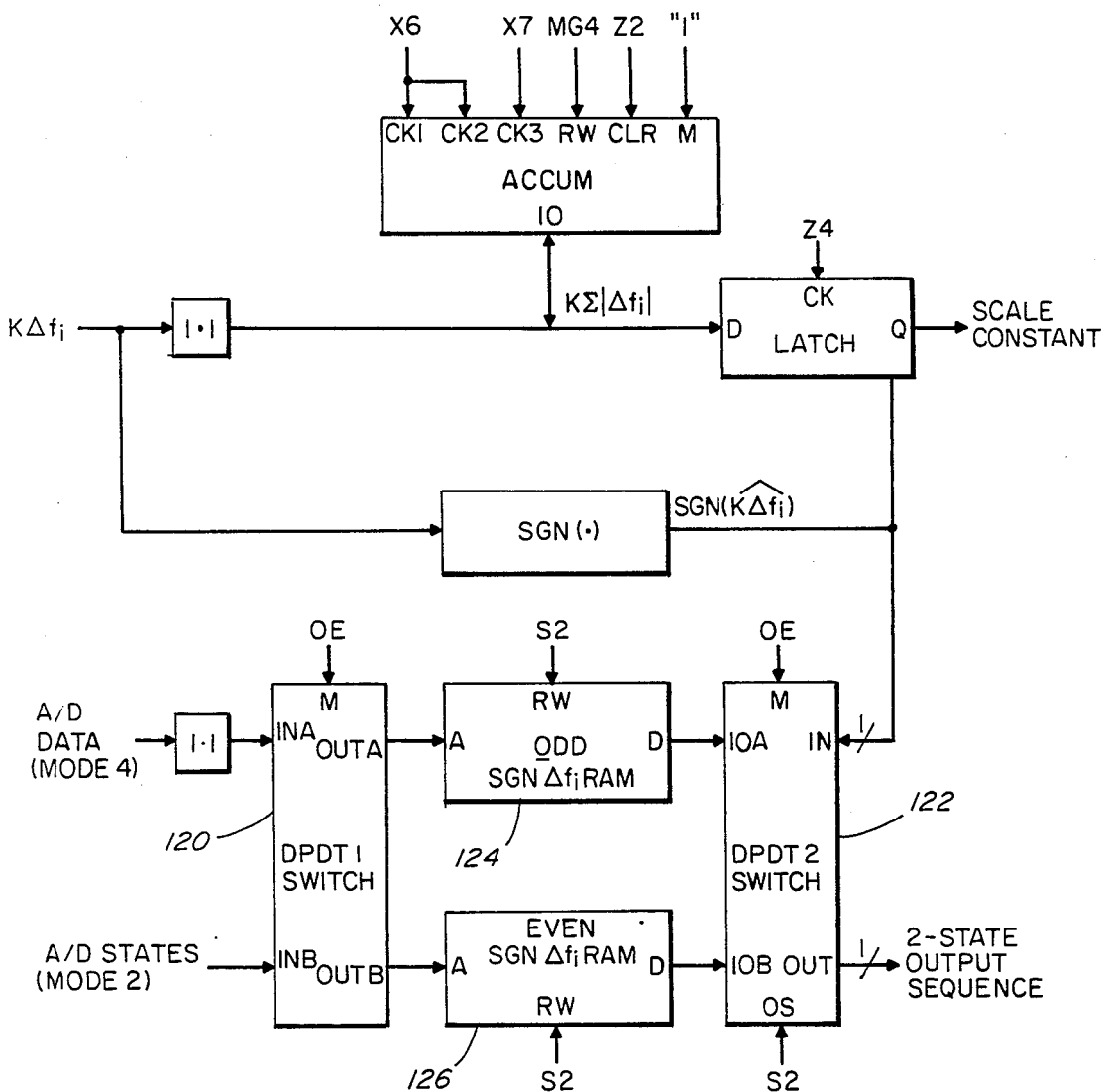
FIG. 16 is an implementation of a 2-state processor.

The operation of a 2-state processor shown in FIG. 16 is very simple since no optimization (Mode 3) needs to be undertaken. The DPDT 1 and 2 switches 120 and 122 and sgn f RAMs 124 and 126 operate exactly as the DPDT 1 and 2 switches 92 and 96 and g-RAMs of the 3-state processor and use the same timing signals. The only difference is that the sign of the $K\hat{\Delta f_i}$ signal instead of the corresponding value of $\hat{g}_i$ is saved in the RAM. The procedure for forming the two-state output data stream is simply to pass the A/D data to the RAM with the stored sgn($K\hat{\Delta f_i}$) values and to replace the A/D sample with the corresponding sgn($K\hat{\Delta f_i}$) value. The output sequence will then be a two-state sequence. Finally, in addition to the generation of the output sequence, a scaling constant is generated by accumulating the $K|\hat{\Delta f_i}|$ values for the entire PDF.

It is thus seen that the objects of this invention have been achieved in that there has been disclosed an interference canceller capable of improving the signal-to-noise ratio of a weak signal corrupted by a stronger noise signal.

What is claimed is:

1. Interference canceller for improving the signal-to-noise ratio of a weak signal corrupted by a larger additive noise signal comprising:

analog-to-digital converter for quantizing said weak signal plus said noise signal into a word of greater than 3 states;

memory means connected to the analog-to-digital converter for storing a finite string of said quantized weak signal plus noise;

first digital processor means connected to the analog-to-digital converter for determining the discrete probability law of said noise;

second digital processor means connected to the first digital processor means and the memory means, said second digital processor means comprising:

means for determining an optimum discrete function based on said probability law of said noise;

means for quantizing said optimum discrete function to two or three states; and means for operating on said string of quantized weak signal plus noise by said quantized optimum discrete function;

whereby the signal to noise ratio of said weak signal is improved and said string of quantized weak signal plus noise is represented by 2- or 3-bit words.

2. The interference canceller of claim 1 wherein said analog-to-digital converter generates 8 bit words.

3. The interference canceller of claim 1 wherein said optimum discrete function is of the form $g_i = \Delta A_i/A_i$ where $A_i$ is a partition area of the discrete noise density function and $\Delta A_i$ is the change in the partition area in the presence of the weak signal.

4. The interference canceller of claim 1 wherein said three states of said optimum discrete function are $-1, 0, +1$ and said two states are $+1$ or $-1$.

5. The interference canceller of claim 1 wherein said analog-to-digital converter operates at a 75 megahertz conversion speed.

6. Interference cancelling method for improving the signal to noise ratio of a weak signal corrupted by a larger additive noise signal comprising:

quantizing said weak signal plus noise signal into a word of greater than 3-bits;

storing a finite string of said quantized weak signal plus noise;

determining the discrete probability law of said noise;

determining the optimum discrete function based on said probability law of said noise; quantizing said optimum discrete function to three states; and operating on said string of quantized weak signal plus noise by said quantized optimum discrete function, whereby the signal to noise ratio of said weak signal is improved and said string of quantized weak signal plus noise is represented by 2- or 3-bit words.

7. The method of claim 6 wherein an analog to digital converter is utilized for quantizing said weak signal plus said noise signal.

8. The method of claim 7 wherein said analog to digital converter generates 8-bit words.

9. The method of claim 7 wherein said analog to digital converter operates at a 75 megahertz conversion speed.

10. The method of claim 6 wherein semiconductor means is provided for storing said finite string of quantized weak signal plus noise.

11. The method of claim 6 wherein said optimum discrete function is of the form $g_i = \Delta A_i/A_i$ where $A_i$ is a partition area of the discrete noise density function and $\Delta A_i$ is the change in the partition area in the presence of the weak signal.

12. The method of claim 6 wherein said three states of said optimum discrete function are $-1, 0 +1$.

* * * * *

UNITED STATES PATENT AND TRADEMARK OFFICE
CERTIFICATE OF CORRECTION

PATENT NO. : 4,727,504

DATED : February 23, 1988

INVENTOR(S) : Paul VanBroekhoven

It is certified that error appears in the above-identified patent and that said Letters Patent is hereby corrected as shown below:

Column 3, line 16, "$-f(x)$" should be -- $-\dot{f}(x)$ --.

Column 5, line 23-25, delete "The derived statistical properties are then used to calculate the optimum non-linearity $g(\cdot)$.";

line 26, after "used" insert --to calculate the optimum non-linearity $g(\cdot)$ and--.

Column 8, line 26, "$g_i$" should be --$\hat{g}_i$--.

Column 8, line 27, "$g_i$" should be --$\hat{g}_i$--.

Column 9, line 65, after "converter" insert --apparatus--.

Column 10, lines 20, 22, 27 and 30, "interference canceller" should be --apparatus--;

line 41, "+⊢"

Signed and Sealed this

Sixteenth Day of August, 1988

Attest:

DONALD J. QUIGG

Attesting Officer

Commissioner of Patents and Trademarks